United States Patent [19]

McQuaid et al.

[11] Patent Number: 5,757,227

[45] Date of Patent: May 26, 1998

[54] AMBIENT TEMPERATURE CADMIUM ZINC TELLURIDE RADIATION DETECTOR AND AMPLIFIER CIRCUIT

[75] Inventors: James H. McQuaid, Livermore; Anthony D. Lavietes, Hayward, both of Calif.

[73] Assignee: The Regents of the University of California, Oakland, Calif.

[21] Appl. No.: 689,447

[22] Filed: Aug. 12, 1996

[51] Int. Cl.⁶ .................................................. G06G 7/12
[52] U.S. Cl. .................................. 327/561; 327/557
[58] Field of Search ............................ 327/72, 74, 51, 327/52, 54, 78, 83, 87, 89, 90, 179, 311, 316, 323, 557, 559, 560, 563; 330/99, 100, 260, 97, 290

[56] References Cited

U.S. PATENT DOCUMENTS

| | | | |
|---|---|---|---|
| 3,927,377 | 12/1975 | Iwazumi | 327/557 |
| 4,016,567 | 4/1977 | Buss | 343/7.7 |
| 4,984,292 | 1/1991 | Millen | 327/557 |
| 5,391,882 | 2/1995 | Rhiger | 250/370.13 |

OTHER PUBLICATIONS

A. D. Lavietes et al., "Development of a Portable Ambient Temperature Radiometric Assaying Instrument", Oct. 1994, UCRL-JC-11714.

A. D. Lavietes et al., "Preliminary Uranium Enrichment Analysis Results Using Cadmium Zinc Telluride Detectors", Sep. 1995, UCRL-JC-121681.

Primary Examiner—Timothy R. Callahan
Assistant Examiner—My-Trang Nu Ton
Attorney, Agent, or Firm—Henry P. Sartorio

[57] ABSTRACT

A low noise, low power consumption, compact, ambient temperature signal amplifier for a Cadmium Zinc Telluride (CZT) radiation detector. The amplifier can be used within a larger system (e.g., including a multi-channel analyzer) to allow isotopic analysis of radionuclides in the field. In one embodiment, the circuit stages of the low power, low noise amplifier are constructed using integrated circuit (IC) amplifiers, rather than discrete components, and include a very low noise, high gain, high bandwidth dual part preamplification stage, an amplification stage, and an filter stage. The low noise, low power consumption, compact, ambient temperature amplifier enables the CZT detector to achieve both the efficiency required to determine the presence of radio nuclides and the resolution necessary to perform isotopic analysis to perform nuclear material identification. The present low noise, low power, compact, ambient temperature amplifier enables a CZT detector to achieve resolution of less than 3% full width at half maximum at 122 keV for a Cobalt-57 isotope source. By using IC circuits and using only a single 12 volt supply and ground, the novel amplifier provides significant power savings and is well suited for prolonged portable in-field use and does not require heavy, bulky power supply components.

19 Claims, 6 Drawing Sheets

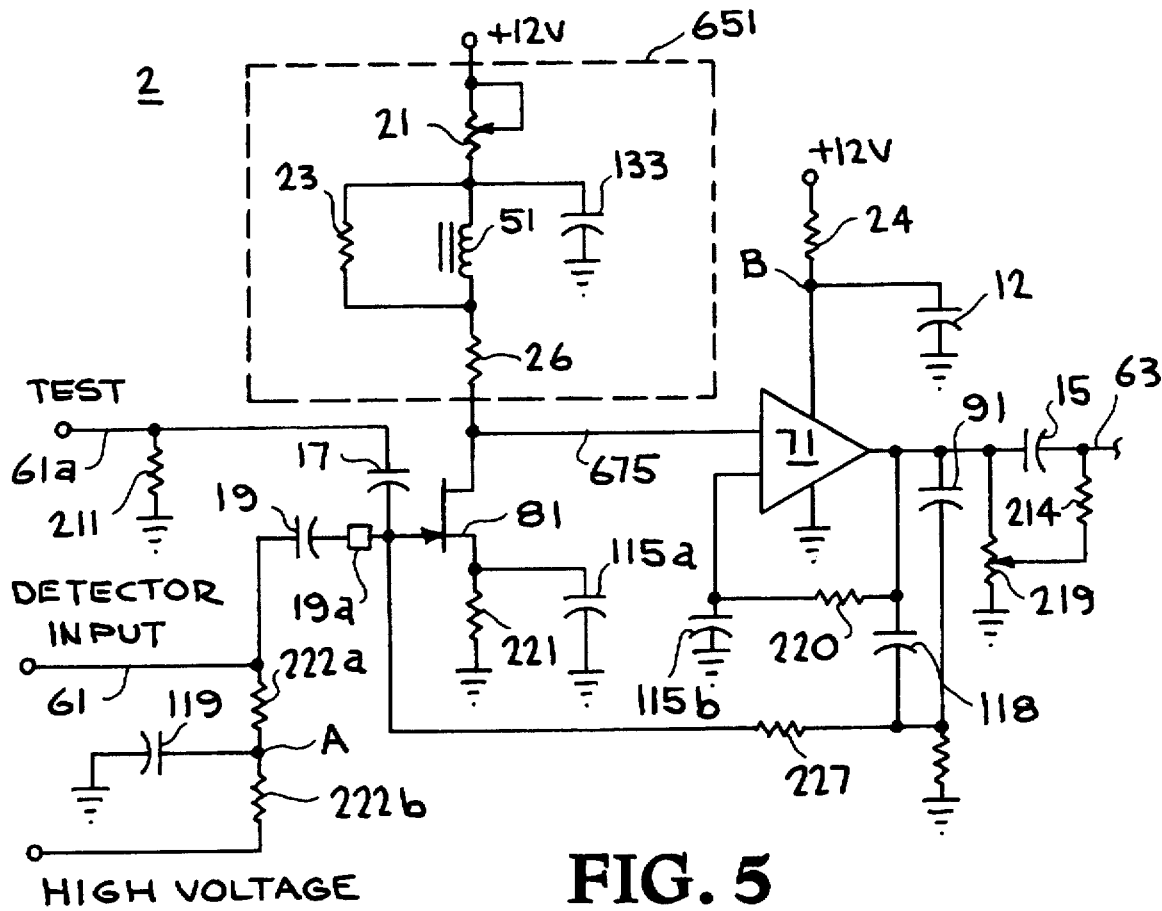
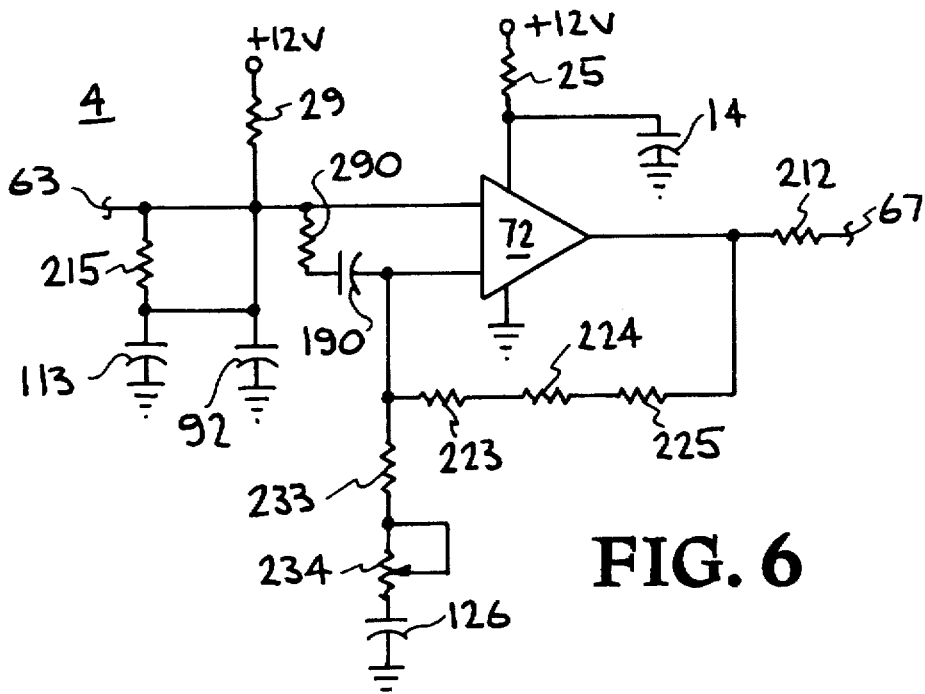
FIG. 5
FIG. 6

AMBIENT TEMPERATURE CADMIUM ZINC TELLURIDE RADIATION DETECTOR AND AMPLIFIER CIRCUIT

The United States Government has rights in this invention pursuant to Contract No. W-7405-ENG-48 between the United States Department of Energy and the University of California, for the operation of Lawrence Livermore National Laboratory.

BACKGROUND OF THE INVENTION

1. Field of the Invention

This invention relates to amplification circuitry for radioactive isotope detectors. Specifically, the present invention relates to a low noise, low power consumption, compact, ambient temperature amplifier circuit for a cadmium zinc telluride (CZT) radiation detector.

2. Description of Related Art

Radiation detectors are well known in the art. Conventional radiation detectors are used in, for example, medical imaging, environmental analyses, uranium enrichment measurements, and other governmental and commercial uses. One well known type of radiation detector is a sodium iodide (NaI) detector. NaI detectors are readily available and provide sufficiently high efficiency (e.g., detection sensitivity) and resolution to determine the presence of radio nuclides of possible interest. Although NaI detectors are able to determine the presence of radio nuclides of possible interest due to their sensitivity, NaI detectors lack the fine resolution necessary to verify the identity of specific radioactive isotopes. That is, NaI detectors generally lack the resolution required for use in isotopic analysis systems. All NaI detectors are a poor choice for high resolution isotopic analysis. Also, NaI detectors require photomultiplier tubes that are typically sensitive to thermal variations in addition to being constructed with glass, creating a mechanical shock limitation. Both of these characteristics make many NaI detectors disadvantageous for prolonged portable in-field and hand-held applications.

Other types of well known radiation detectors, such as liquid nitrogen cooled germanium (Ge) detectors are able to provide the resolution necessary for isotopic analysis. However, such detectors are bulky and, therefore, are not conveniently portable or made hand-held. In order to use a liquid nitrogen cooled Ge detector "in the field," a supply of liquid nitrogen must be carried along with the detector. Further, Ge detectors use amplifiers that incorporate both discrete and monolithic components that require relatively large amounts of power. Hence, Ge detectors are not well suited for use in remote environments, and are even more poorly suited for covert measurements and other hand-held applications.

Cadmium telluride (CdTe) detectors are also known in the art. The solid state CdTe material used in CdTe detectors has a relatively high atomic number of 50. As a result, CdTe detectors have a large cross section for interaction with incident gamma rays than GE or NaI detectors. CdTe also has a large band gap of 1.44 eV, thereby reducing the bulk generated leakage current and allowing operation at room temperature. Furthermore, by adding zinc (Zn) to form cadmium zinc telluride (CZT), the band gap of the detector material is increased to approximately 1.6 eV. By operating at room temperature, the need for cooling is eliminated. Thus, unlike Ge detectors, CZT detectors do not require bulky liquid nitrogen (LN) cooling systems. Hence, CZT detectors can be made more compact and more easily portable than are Ge detectors.

CZT detectors offer a resolution somewhere between the high resolution Ge detectors and the low resolution NaI detectors. Specifically, CZT detectors provide greater resolution than NaI detectors, but provide less resolution than is realized by Ge detectors. A comparison of the resolution of NaI, liquid nitrogen cooled Ge, and CZT detectors for a uranium source is shown in FIG. 1. Low resolution spectrum 671 is for the NaI detector, moderate resolution spectrum 673 is for the CZT detector and high resolution spectrum 675 is generated by the Ge detector. In addition, as discussed in U.S. Pat. No. 5,391,882 to Rhiger, entitled "Semiconductor Gamma Ray Detector Including Compositionally Graded, Leakage Current Blocking Potential Barrier Layers and Method of Fabricating the Detector," much of the noise which affects the resolution of a CZT detector originates in the amplifier of the detector. Moreover, in order to perform isotopic analyses, a CZT detector must be able to achieve a resolution of less than 3% full width at half maximum (FWHM) at 122 keV for a Cobalt-57 isotope source so that the enrichment level of uranium can be adequately determined.

All of the above mentioned prior art radiation detectors utilize discrete components such as field effect transistors in their internal circuitry to provide amplification, buffering and signal processing. Such discrete components are selected for high band width and low noise operation because the detectors operate at a high band width since the signals or pulses detected by the above mentioned detectors have rise times which are on the order of nanoseconds. It is well known that high band width and low noise characteristics are diametrically opposed, e.g., the higher the band width, the greater the noise in a circuit. Thus, discrete components, which are known to produce less noise than integrated circuits, are typically employed in the above mentioned radiation detectors.

Although discrete components produce less noise, discrete component circuitry requires larger areas and therefore necessitates a larger detector package. Further, the discrete components themselves consume a relatively large amount of operating power, thus reducing their effectiveness for battery powered, portable, applications. Although discrete components reduce one problem, circuit noise, discrete components produce another problem of increased detector package size. Therefore, use of discrete components limits the portability as well as potential application for the resultant detector system.

Thus, a need exists for a low noise, low power, compact, ambient temperature amplifier which enables a radiation detector to achieve the efficiency required to perform isotopic analysis therefrom. The present invention offers such a solution.

DISCLOSURE OF THE INVENTION

A low noise, low power consumption, compact, ambient temperature signal amplifier for a Cadmium Zinc Telluride (CZT) radiation detector is described. The amplifier can be used within a larger detection system (e.g., including a multi-channel analyzer) to allow isotopic analysis of radio nuclides in the field. In one embodiment, the circuit stages of the low power, low noise amplifier are constructed using integrated circuit (IC) amplifiers, rather than discrete components, and include a very low noise, high gain, high bandwidth preamplification stage, an amplification stage, and a filter stage. The low noise, low power consumption, compact, ambient temperature amplifier enables the CZT detector to achieve both the efficiency and the resolution necessary to perform isotopic analysis to perform nuclear material identification. The present ambient temperature, low noise, low power compact amplifier allows the CZT detector to achieve high resolution levels while being readily portable for in-field use for prolonged periods of time. The present low noise, low power, compact, ambient temperature amplifier enables a CZT detector to achieve resolution of less than 3% full width at half maximum at 122 keV for a Cobalt-57 isotope source. By using IC circuits and using only a single 12 volt supply and ground, the amplifier of the present invention provides significant power savings and is well suited for prolonged portable in-field use and does not require heavy, bulky power supply components.

The CZT detector using the amplifier of the present invention is well suited for the following exemplary applications: nuclear smuggling activities, enhanced surveillance of nuclear weapons assembly and disassembly plants, uranium enrichment analysis, plutonium isotopic analysis, environment monitoring for radioactive isotopes at government facilities, x-ray radiation detection, x-ray fluorescence, nuclear power plant monitoring, and any other moderate resolution (3% resolution at 122 Kev) gamma- ray or x-ray detection application.

BRIEF DESCRIPTION OF THE DRAWINGS

The accompanying figures, which are incorporated in and form a part of this specification, illustrate embodiments of the invention and, together with the description, serve to explain the principles of the invention.

FIG. 5 illustrates a circuit schematic of one embodiment of the low noise, high bandwidth preamplification stage of the present invention CZT detector amplifier circuit.

FIG. 6 illustrates a circuit schematic of one embodiment of the amplification stage of the present invention CZT detector unit.

BEST MODE FOR CARRYING OUT THE INVENTION

Reference will now be made in detail to the preferred embodiments of the invention, examples of which are illustrated in the accompanying figures. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, a CZT detector and an amplifier unit for same, numerous specific details are set forth in order to provide a thorough understanding of the present invention. However, it will be obvious to one of ordinary skill in the art that aspects of the present invention may be practiced without these specific details. In other instances, well known methods, procedures, components, and circuits have not been described in detail as not to unnecessarily obscure aspects of the present invention.

Figure 1:
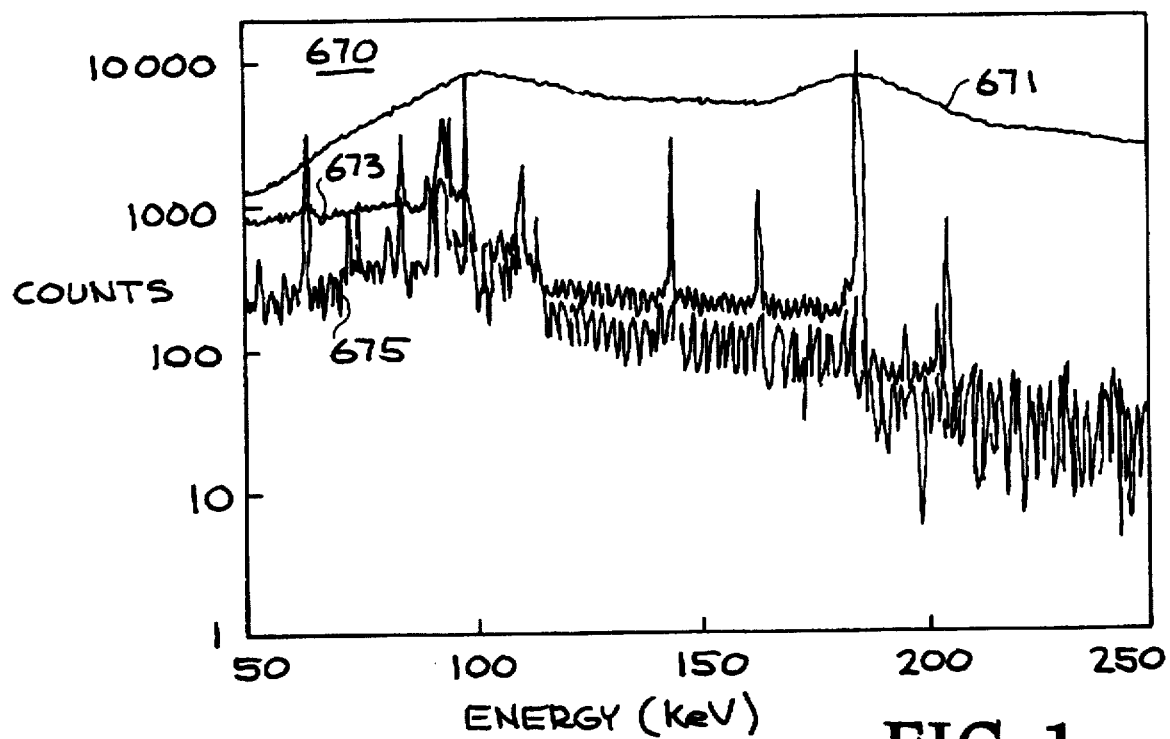
FIG. 1 is graph showing uranium spectra, one spectrum measured using a NaI detector, one spectrum measured using a liquid nitrogen cooled Ge detector, and one spectrum measured using a CZT detector.
Figure 2:
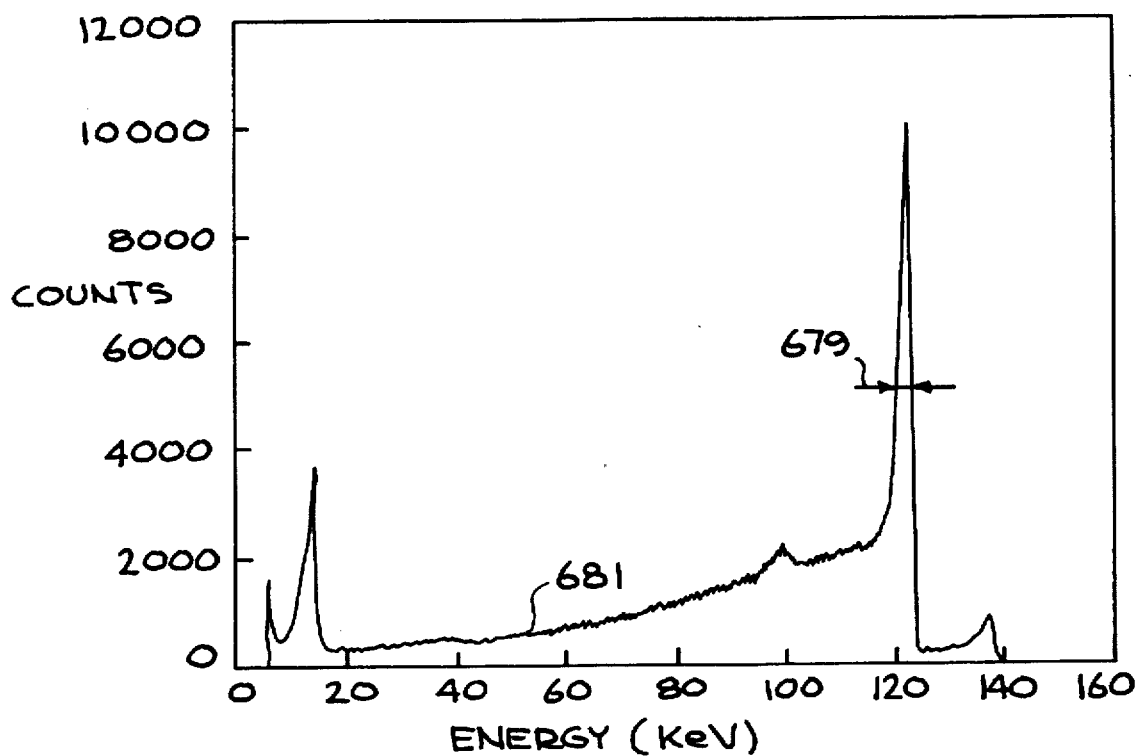
FIG. 2 is an energy spectrum of a Cobalt sample (Co 57) using a CZT detector of the present invention, showing its energy resolution of 2.6 keV at 122 keV.

The present invention amplifier circuit is advantageously composed of integrated circuit (IC) operational amplifiers to achieve a compact size and reduced power consumption. The amplifier circuitry of the present invention is powered by a single ended +12 volt supply. Use of a CZT detector allows operation in ambient temperature ranges. FIG. 2 shows an example spectrum 681 obtained using the present invention CZT detector and amplifier unit using a Co 57 source and a 5 mm×5 mm×5 mm CZT detector. The energy resolution of the 122 keV peak is approximately 2.6 keV full width at half maximum (FWHM), shown as point 679. As represented by FIG. 2, the present invention is able to obtain energy resolution on the order of less than 3 percent, which is acceptable in many isotopic analysis applications. As described further below with reference to FIGS. 5, 6, 7A and 7B, the present invention amplifier contains unit 600 low noise designs to reduce peak width variations attributed to signal noise. This provides for better resolution because electronic noise increases the spectral peak width.

Figure 3:
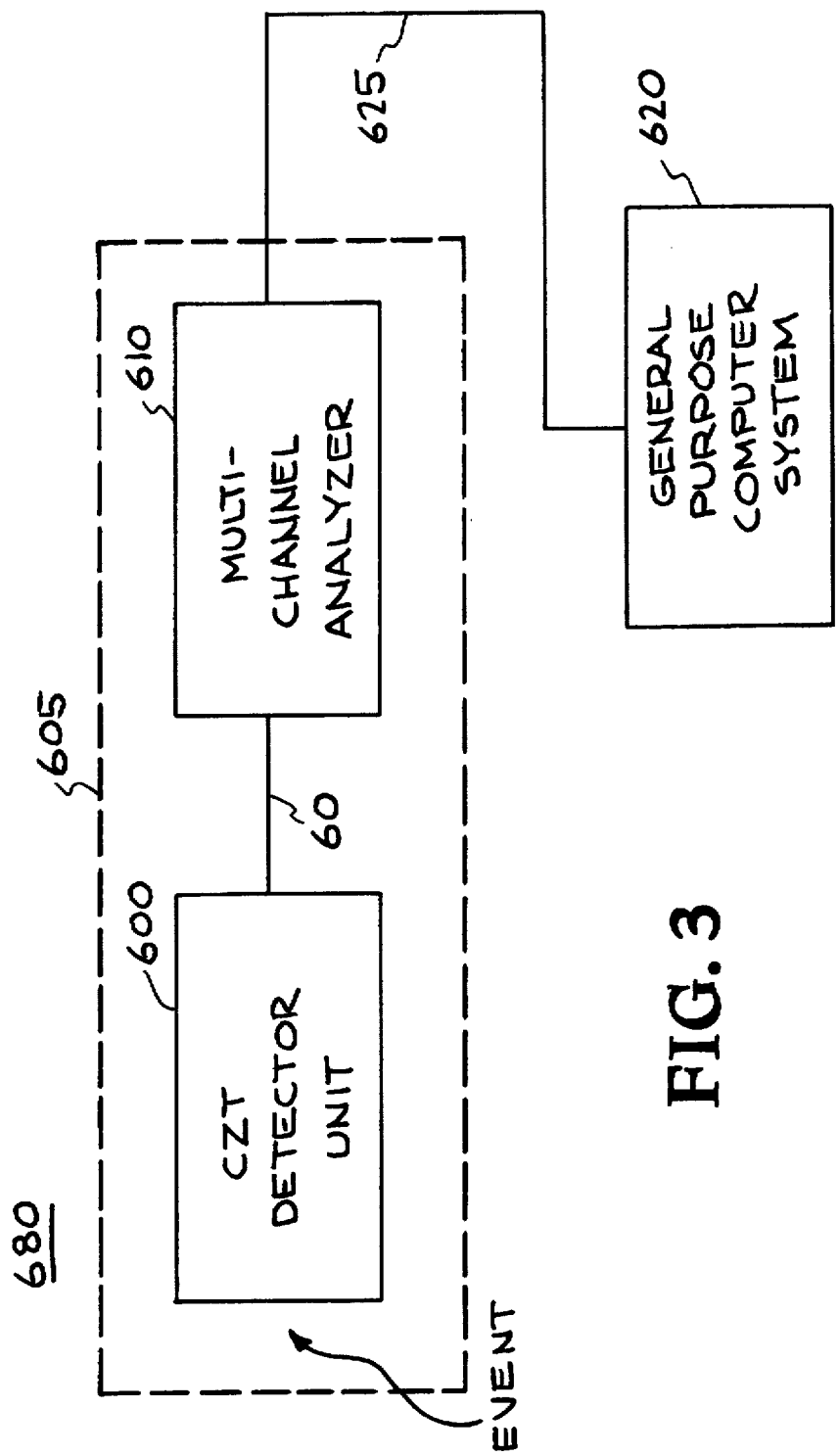
FIG. 3 illustrates a block diagram of the energy spectrum detection and analysis system of the present invention.

FIG. 3 illustrates an overall system 680 in accordance with one embodiment of the present invention. System 680 contains a CZT detector unit 600 of the present invention coupled to a multi-channel analyzer (MCA) unit 610 via bus 60. Bus 60 includes a data path for carrying an analog signal representing an amplified and shaped pulse originating from CZT detector 600 for the MCA unit 610. Bus 60 also contains +12v power supply lines (and ground) from the MCA unit 610, other control signal lines are also present in bus 60. CZT detector unit 600 and MCA unit 610 together form the field unit 605 portion of system 680 which is readily portable and hand-held for in-field applications. In one embodiment, MCA unit 610 is a MicroNOMAD unit from EG&G ORTEC of Oak Ridge, Tenn., although many MCA units can be used as unit 610. Unit 610 contains an analog to digital converter (ADC) to convert the input analog pulse into a digital signal which is then binned into internal memory to maintain a history of counts per energy channel. Unit 610 can also contain a processor and is capable of maintaining multiple spectra. Unit 610 also contains a communication port (e.g., RS-232 or RS-485) for communication over parallel bus 625 with a general purpose computer system 620 (e.g., x-86 architecture, etc.). System 620 can also be of a portable design within the scope of the present invention. Using system 680, in-field automatic nuclide identification can be performed using well known analytical software (e.g., operating on system 620) designed for radiation detectors.

Figure 4:
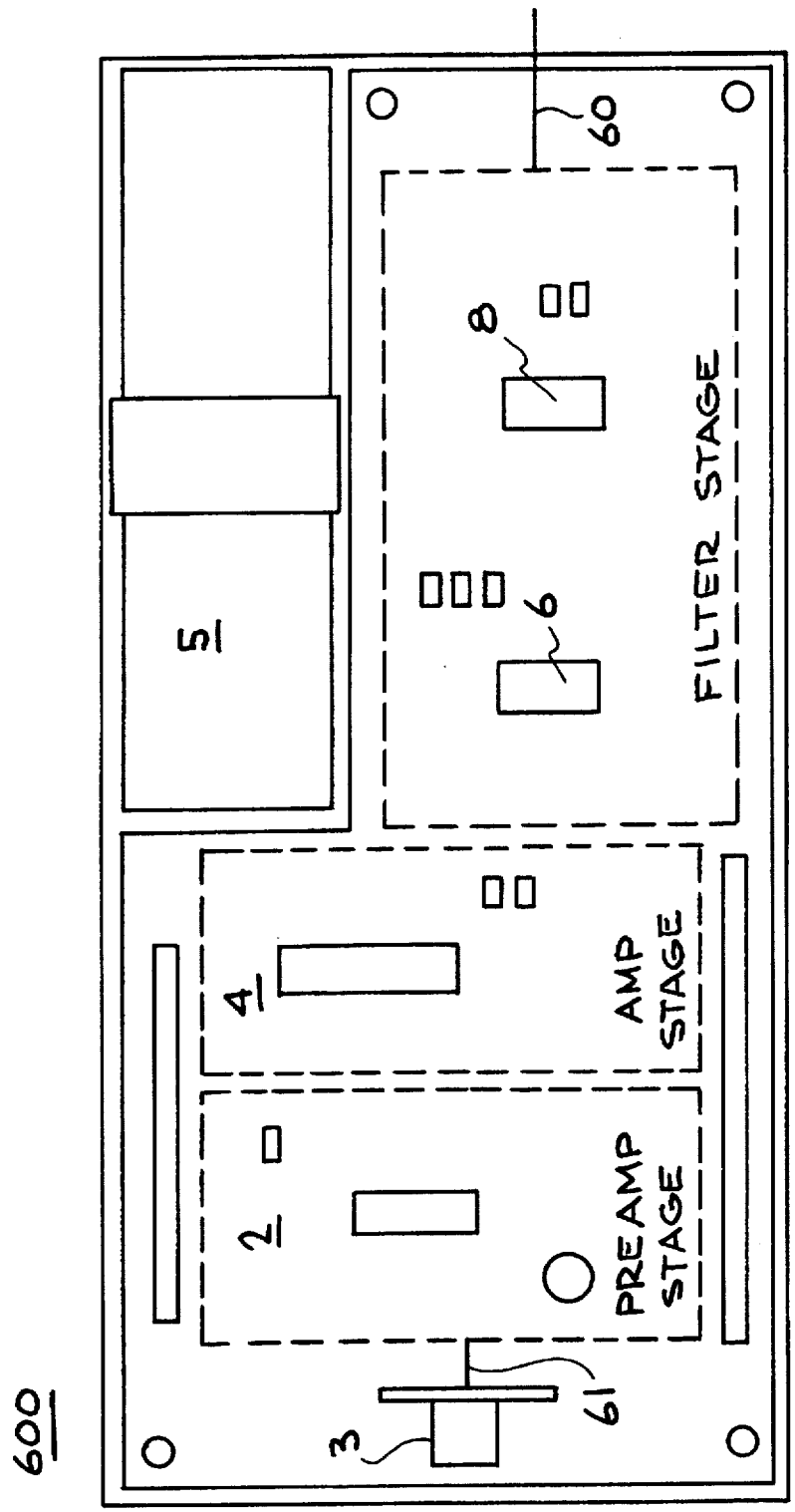
FIG. 4 is a block diagram of the CZT detector unit of the present invention, including the preamplification stage, the amplifier stage, and the filter stage.

FIG. 4 is a block diagram of the CZT detector unit 600 in accordance with the present invention. Unit 600 contains a CZT detector assembly 3 (e.g., of size 5 mm×5 mm×5 mm) positioned to receive incident gamma or x-ray radiation from a target isotope. Different sized CZT detectors can be used within the scope of the present invention. CZT detector assembly 3 is coupled to signal path 61 which is received by a first circuit stage 2 of the present invention amplifier design. The first stage 2 (preamplifier stage) is a high bandwidth, high gain, low noise amplification circuit stage that, unlike prior art designs, performs more than a buffering function. The first stage 2 has a 21 ns rise time and is coupled to a second circuit stage 4 (amplification stage) which performs a differentiation function as well as an amplification function. The second stage 4 captures the leading edge of the amplified pulse for pulse amplification. Given the count rate experienced by the present invention, charge collection within unit 600 is approximately between 80–250 ns per event with little or no pulse pile-up problems. The second stage 4 is coupled to a third circuit stage (filter stage) that is composed of two circuit blocks 6 and 8 which together form a filter stage. The filter stage uses a Sallen-Key filter design and integrates over the detected leading edge of the pulse for a specified time constant to determine the energy of the event.

The filter stage of FIG. 4 has a sharp noise-corner response, which is important in reducing parallel noise and at the same time minimizing ballistic deficit due to slow charge collection of the detector. The shaping time of the filter stage is 0.5 us. The optimum theoretical shaping time for the electronics is between 4–6 us, based on the capacitance of the detector and other circuit parameters. However, detector charge trapping phenomena has a pronounced effect on resolution, and as a result, the filter time constant is optimal at 0.5 us. This reduces the amount of low-energy tailing. The second circuit block 8 is designed with a higher Q than circuit block 6 which improves performance and results in a near Gaussian output pulse shape. As shown in FIG. 4, the signal path portion of bus 60 is coupled to the output of circuit block 8 of the filter stage. System 680 also optionally contains a high voltage power supply 5 for the detector bias (e.g., a singled ended (+12v) voltage supply).

The discussion below presents a detailed description of circuit stage 2, stage 4 and the filter stage including circuit blocks 6 and 8 of the present invention amplifier design.

With reference to FIG. 5, the two part preamplification circuit stage 2 of the present invention is shown in schematic form. Signal path ("line") 61 is coupled to the CZT detector assembly 3 (FIG. 4). Stage 2 is capable of a signal rise time of approximately 21 ns. Gamma and x-ray radiation interactions (events) in the CZT detector assembly 3 create electron-hole pairs that generate charge over line 61. Line 61 is coupled to capacitor 19 (0.001 uF, in one embodiment). Capacitor 19 includes, or alternatively is coupled (in series) to, a ferrite bead 19a to absorb high voltage transients (noise) in the input line 61. Line 61 is also coupled to a resistor 222a (1 kM ohm) which is coupled in series to capacitor 119 (0.001 uF, in one embodiment), at node A. Capacitor 119 is coupled to ground. High voltage is connected to resistor 222b which is coupled to node A. Resistor 222a, resistor 222b, and capacitor 119 act as a high voltage filter network on the input line 61. Resistor 222a is parallel to the input line 61, and as described below, is of a particular design to reduce parallel noise (e.g., shot noise) in the signal path. Capacitor 19 is also coupled to the gate of a field effect transistor (FET) 81. Also coupled to the gate of FET 81 is a test network consisting of capacitor 17 (0.2 pF) coupled to a test input 61a and also to a resistor 211 (1 k ohm) which is coupled to ground on a first end and coupled to the test input 61a on the other. Test pulses can be introduced via the test input 61a.

Also coupled to the gate of FET 81 is a feedback resistor 227 (1 kM ohm) which is coupled to the output port of an operational amplifier 71 through capacitor 118. Feedback resistor 227 contributes approximately 0.2 pF of parasitic capacitance for stage 2 and is discussed in further detail below. Zener diode 91 (also coupled to resistor 227) is coupled to the output of opamp 71 and coupled to ground via resistor 231 (2.15 k ohm). The source of FET 81 is coupled to a bias network consisting of a bias resistor 221 (82 ohm) which is coupled to ground. The bias network includes resistor 221 which is coupled in parallel with an AC bypass capacitor 115a (6.8 uF) to establish a correct operating point for FET 81. The drain of FET 81 is coupled to a drain network 651 consisting of resistor 26, inductor 51, resistor 23, capacitor 113, and potentiometer (pot) 21 which is coupled to a +12 volt voltage supply (e.g., a single ended supply). Specifically, bias resistor 26 (100 ohm) is coupled to the drain of FET 81. Resistor 23 (19.6 k ohm) and inductor 51 (22 mH) are both coupled to each other on one end and to resistor 26 on the other end, in parallel fashion. The top node of resistor 23 and inductor 51 is coupled to capacitor 133 (6.8 uF) which is coupled to ground. The above node is also coupled to pot 21 which is coupled to the +12 volt supply. Capacitor 133 provides an AC coupling to ground for noise reduction. FET 81, its drain circuitry, and its source circuitry comprise the first part of preamplifier stage 2. FET 81 is selected to be of very low noise and in one embodiment is Seiko part number SK152, however, alternative FETs meeting the requirements outlined herein can also be used.

The second part of preamplifier stage 2 of FIG. 5 consists of operational amplifier (opamp) 71 and its bias and feedback circuitry which are described below. Opamp 71 is selected to be of high bandwidth, having a high open loop gain, and having stability and low noise within the 50 kHz to 100 MHz range. Opamp 71 is also of an IC design so that the overall amplifier unit 600 can be of a compact size with low power consumption. In one embodiment, the AD 840 opamp is selected which is available from Analog Devices. The voltage supply input of opamp 71 (node B) is coupled to resistor 24 (10 ohm) which is coupled to the +12 voltage supply. Node B is also coupled to capacitor 12 (6.8 uF) which is coupled to ground and acts as a filter for the voltage supply. The negative voltage supply of opamp 71 is coupled to ground. The drain of FET 81 is also coupled to the non-inverting (+) input of opamp 71.

The output of opamp 71 is routed through two feedback paths. The first feedback path is fed to the inverting input of opamp 71 while the second feedback path is routed back to the gate of FET 81 (the first part). The first feedback path couples the output of opamp 71 to resistor 220 (10 k ohm) which is coupled to the inverting input of opamp 71. The inverting input of opamp 71 is also coupled to capacitor 115b (6.8 uF) which is coupled to ground. The output of opamp 71 is also coupled to capacitor 118 (6.8 uF) which is coupled to ground through resistor 231 (2.15 k ohm). The second feedback path comprises resistor 227 (1 kM ohm) which is coupled between the gate of FET 81 and the output of opamp 71 via capacitor 118. The output of opamp 71 is also coupled to pot 219 (which is coupled to ground) and to capacitor 15 (390 pF) which is coupled to the wiper of pot 219 through resistor 214 (42.2 k ohm). The output of the first stage 2 is taken at signal path 63 from capacitor 15. The above design enhances the transconductance of the input of circuit stage 2 to reduce series noise at the input.

In operation of circuit stage 2, during a charge collection event, the impedance of the drain circuit 651 of FET 81 increases proportionally to the change in current in the inductor 51. The gain of the first part of circuit 2 is related to the total impedance of the drain circuit 651 divided by the total impedance of the circuitry coupled to the source of FET 81 (resistor 221 and capacitor 115a). The circuitry coupled to the source of FET 81 is of low AC impedance (AC bypass) and reduces any noise seen at the source of FET 81.

Of less consequence, resistor 221 is of low resistance (82 ohms) and produces only a small amount of thermal noise. During a charge event, the impedance of circuit 651 is approximately 300 times larger than that of the circuitry coupled to the source of FET 81 providing a high gain in the first part of preamplifier stage 2. It is appreciated that within the first part of circuit 2, a very high transconductance is maintained in the input signal path to reduce series noise. Series or high frequency noise, is a function of the transconductance of the input stage which is primarily composed of resistances in series with the input path. For example, to reduce series noise, no resistors, diodes or inductor elements are placed on the input signal path 61. The same is true with respect to path 63 (FIG. 6).

In order to utilize a single ended +12 volt supply, opamp 71 of FIG. 5 needs to operate biased on a virtual ground at its inputs. This virtual ground voltage is designed to be a value between ground and +12 volts (e.g., 6.6 volts). The present invention provides the virtual ground in a manner preserving low noise, high bandwidth (e.g., 400 MHz) and high gain. The bias circuitry in the present invention is provided such that the impedance at the inverting input to opamp 71 is low to maintain low noise and preserve the open loop gain of opamp 71 (e.g., 10 @50 MHz). Also, it is disadvantageous to ground the inverting input of opamp 71 due to its single ended power supply configuration. The bias circuitry used in the present invention is established through the combination of drain circuit 651 (excluding capacitor 133), resistor 221, resistor 220, diode 91 and resistor 231. As shown, the inverting input to opamp 71 is bypassed to maintain low input impedance at the same time providing the virtual ground at approximately 6.6 volts. Specifically, the inverting input of opamp 71 is bypassed to preserve the open loop gain (e.g., 10) of opamp 71 providing operational stability and low noise.

The first part (e.g., FET 81 circuitry) and second part (e.g., opamp 71 circuitry) of circuit 2 share a same feedback path along resistor 227. Using the circuitry as shown in FIG. 5, the circuitry of stage 2 stabilizes itself by seeking its own operating point through feedback resistor 220 back to the inverting input of the opamp 71. Therefore stage 2 has an operating point derived by the bias network comprising drain circuitry 651 (excluding capacitor 133), resistor 221 at the source of FET 81, resistor 220, resistor 231, and diode 91. Further, using the above bias network, a low impedance is seen at the inverting input of opamp 71 not only due to the DC feedback present in this bias network but also due to its AC bypassing. It is appreciated that resistor 227 provide both AC feed back and DC feedback to the input signal path 61, with DC feedback providing voltage stability to provide a discharge path for the gate of FET 81.

The arrangement of FIG. 5 allows any charge impulse seen at the gate of FET 81 to be collected and amplified by the charge loop circuitry of circuit stage 2 according to the Miller effect; the Miller effect uses a capacitance, a gain stage (including FET 81) and the amplifier 71. The charge loop circuitry effectively amplifies the sub pF capacitance of resistor 227 (parasitic capacitance of approximately 0.2 pf) to appear as a sub nF capacitance by multiplying the sub pF capacitance of resistor 227 by the open loop gain of circuit stage 2 (minus one). This arrangement of amplifying the capacitance between the input and the output of circuit stage 2, contributes to the low noise, high bandwidth, and high stability characteristics of the present invention amplifier.

In view of the above, the overall gain contribution of opamp 71 can be expressed as a ratio of the capacitance of the CZT detector (e.g., 5 pF), divided by the capacitance of the feedback loop consisting of resistor 227 (e.g., the parasitic capacitance of approximately 0.2 pF). This gain is approximately on the order of 10. Given that the gain of the first part of circuit 2 is approximately 300, as contributed by FET 81, the overall gain of the amplification stage 2 is therefore approximately 3000.

Resistor 227 is selected such that it offers uniform distribution of parasitic inductance and uniform distribution of parasitic capacitance over its length. This characteristic allows resistor 227 to have a high and constant linear impedance across a wide frequency band. This characteristic contributes to a 10–15 percent reduction in noise (compared with commercial preamps) in the overall amplifier unit 600 and avoids non-linear effects. The expected signal form of the pulse at path 63 of FIG. 5 is an exponential shape that decays to ground. If resistor 227 contains nonlinear parasitic capacitance and/or inductance over the frequency range of circuit stage 2, signal overshoot and undershoot problems occur representing pulse signal distortion, from circuit stage 2, that reduces the overall resolution of the CZT detector 600. Without the uniform distribution of parasitic capacitance and inductance within resistor 227, as used in the present invention, at the middle frequency range of operation of circuit stage 2, resistor 227 can have an effective resistance of 40–50 M ohms instead of 1 kM ohms, causing increased signal distortion, Johnson noise, and non-linearity. For analogous reasons as presented above, resistor 222a also is selected such that it offers uniform distribution of parasitic inductance and uniform distribution of parasitic capacitance over its length. As shown in FIG. 5, resistor 222a is in parallel with the input signal path 61.

Figure 7A:
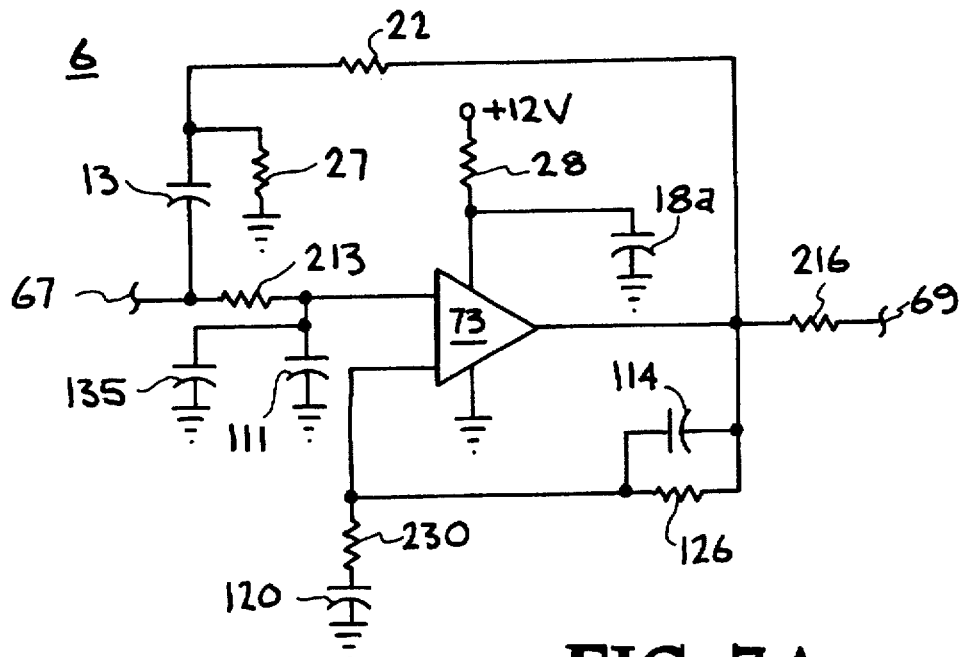
FIG. 7A and FIG. 7B illustrate a circuit schematic of one embodiment of the two part filter stage of the present invention CZT detector unit.
Figure 7B:
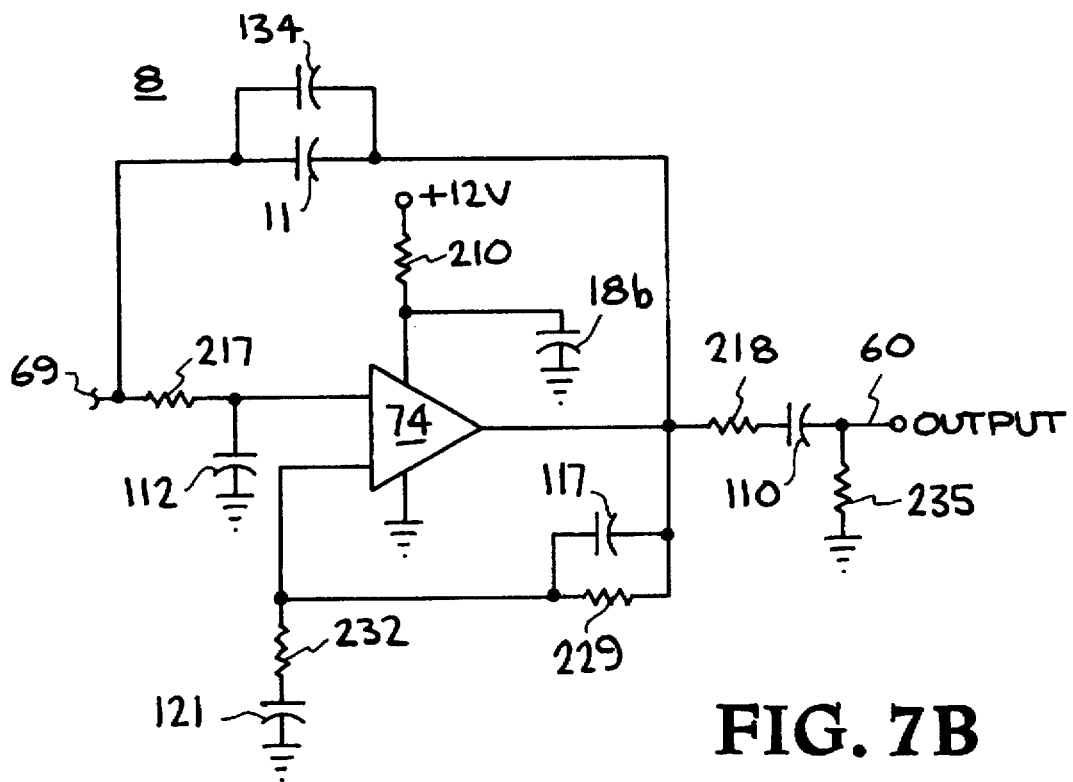

The remaining circuit stages of FIG. 6, FIG. 7A and FIG. 7B comprise a shaping circuit which includes an amplification stage 4, amplification of the differentiated signal, (FIG. 6) and a Sallen-Key filter as circuit blocks 6 and 8 (FIGS. 7A and 7B). The above circuit stages and blocks include integrated circuit opamps and are each non-inverting stages that are biased by the +12 volt supply and ground for power efficiency. The shaping circuit within the present invention is designed to provide an optimum shaping time constant of 0.5 us.

With reference to FIG. 6, the amplification stage circuit 4 of the present invention is shown in schematic form. Circuit stage 4 receives the differentiated pulses over input path 63 in order to (1) reduce noise for signal processing, (2) amplify the differentiated signal from the charge loop of circuit stage 2, and (3) reduce pile up from closely spaced events. Circuit stage 4 includes an integrated circuit opamp 72 which is connected to the +12 volt supply and ground. Opamp 72 is selected for low noise and high bandwidth. The +12 volt power supply connection is also filtered by capacitor 14 (6.8 uF). The signal path 63 is connected directly to the non-inverting input of opamp 72 and in one embodiment without any series noise producing elements introduced in path 63. Path 63 is also coupled to a resistor 215 (1.1 k ohm) which is coupled in series to a first terminal of capacitor 113 (15 uF) which capacitor is itself coupled to ground. The first terminal of a bypass capacitor 113 is also coupled to a first terminal of a zener diode 92 which diode is itself grounded. The first (cathode) terminal of the zener diode 92 is also coupled in series to resistor 29 (5.11 k ohm) which is coupled to the +12 volt supply. The non inverting input of opamp 72 is also coupled to resistor 290 (51.1 ohm) which is coupled in series to capacitor 190 (100 pF), which in turn connects to the inverting input of opamp 72.

Circuit stage 4 of FIG. 6 also contains a feedback path. The feedback path begins at the output of opamp 72, through resistor 225 (2.15 k ohm) which is couples in series to resistor 224 (2.87 k ohm) which is coupled in series to resistor 223 (5.11 k ohm) which is coupled to the inverting input of opamp 72. Also coupled to the inverting input of opamp 72 is resistor 233 (511 ohm) which is coupled in series to potentiometer 234 (used for fine gain adjustment) which is coupled in series to capacitor 126 (6.8 uF) which is coupled to ground. Coarse gain adjustment can be effected by shorting out combinations of resistors 223, 224, and 225. The output (node 67) of circuit stage 4 is taken through resistor 212 (261 ohm) which is coupled to the output of opamp 72.

Since a single ended +12 volt supply is used in the present invention, circuit stage 4 of FIG. 6 contains a specialized bias network to provide a virtual ground at the opamp 72's inputs at approximately 6 volts. In the singled ended +12 volt configuration of the present invention, the inputs to opamp 72 cannot be grounded, nor can the bias voltage be directly applied to these inputs. Further, zener diode 92 cannot be directly coupled to the input of opamp 72 because this would effectively "ground" the input signal path 63. Nor can zener diode 92 be placed in the feedback loop because this would adversely affect the linear feedback for opamp 72. Therefore, this bias voltage is established at the node between differentiating resistor 215 and zener diode 92 with zener diode 92 selected (e.g., raising the "ground" voltage up) to establish the desired virtual ground. Capacitor 113 bypasses electronic noise associated with zener diode 92. The zener diode 92 is of low impedance (e.g., 10 ohms), therefore the impedance to ground seen by the input signal path 63 is approximately the resistance of resistor 215. The low impedance of zener diode 92 aids in noise reduction. In addition, in the design of FIG. 6 there are no resistors in series with the signal path 63.

The output voltage along path 67 of circuit stage 4 of FIG. 6 represents the energy of the interacting gamma or x-ray event with the CZT detector assembly 3. This signal is next integrated to further enhance energy resolution.

With reference to FIG. 7A and FIG. 7B, the two circuit blocks 6 and 8, respectively, of the filter stage of the present invention are shown in schematic form. The filter stage of the present invention is designed to shape the energy signal of a detected event while reducing high frequency noise. The noise associated with the filter stage, if not reduced, will distort the peak amplitude of the resulting Gaussian pulse, leading to errors in the determined energy level for the event. The filter stage of FIG. 7A and FIG. 7B receives a pulse with a rise time determined by the charge collected time of the CZT detector assembly 3 and circuit stage 2. This pulse is translated by the filter stage into a near Gaussian pulse shape. Therefore, the output of the filter stage is a near Gaussian pulse with reduced noise. As discussed above, the optimum shaping time constant used within the present invention is 0.5 us, in which both the filter stage (circuit stages 6 and 8) and differentiation time constants are matched. As discussed further below, the filter (shaping) stage contributes to reducing the unwanted effects of hole trapping within the CZT assembly 3.

FIG. 7A illustrates the first circuit stage 6 of the Sallen-Key filter arrangement of the present invention. Circuit path 67 is coupled to a first terminal of resistor 213 (261 ohm) which is coupled in series to the non-inverting input of opamp 73. Opamp 73 is realized using an IC design and is coupled to the +12 volt supply through resistor 28 (10 ohm) which is filtered by capacitor 18a (6.8 uF) which is coupled to ground. The negative supply terminal of opamp 73 is grounded. The first terminal of resistor 213 is also coupled to a first terminal capacitor 13 (820 pF) which is coupled at a second terminal in series to resistor 22 (1 k ohm) which is coupled to the output of opamp 73. Resistor 27 (82.5 ohm) at one end is coupled at the second terminal of capacitor 13 and is coupled at the other end to ground. One feedback path consists of resistor 22, resistor 27, and capacitor 13.

The positive (e.g., non-inverting) input of opamp 73 is also coupled to parallel capacitors 111 (680 pF) and 135 (100 pF) which are coupled to ground. The output of opamp 73 is coupled to resistor 216 (261 ohm) as well as coupled in a second feedback path to resistor 126 (1 k ohm) and coupled to capacitor 114 (22 pF). Resistor 126 and capacitor 114 are coupled to each other in parallel and on one side coupled to the inverting input of opamp 73. The inverting input of opamp 73 is coupled to resistor 230 (82.5 ohm) which is coupled in series to capacitor 120 (6.8 uF) which is coupled to ground. The output of circuit stage 6 is taken at path 69 from resistor 216.

FIG. 7B illustrates the second circuit stage 8 of the Sallen-Key filter design of the present invention. Circuit path 69 is coupled to resistor 217 (261 ohm) which is coupled to the non-inverting input of opamp 74. Opamp 74 is realized using an IC design and is coupled to the +12 volt power supply through a first terminal of resistor 210 (10 ohm). The first terminal of resistor 210 is also coupled to capacitor 18b (6.8 uF) which is coupled to ground. The negative supply terminal of opamp 74 is coupled to ground. The non-inverting input of opamp 74 is also coupled to capacitor 112 (820 pF) which is coupled to ground. In one feedback path, the output of opamp 74 is coupled to a pair of capacitors 134 (200 pF) and 11 (1000 pF) which are coupled together in parallel and coupled to the input path 69. In a second feedback path, the output of opamp 74 is coupled to resistor 229 (1 k ohm) and capacitor 117 (22 pF) which are coupled together in parallel. Resistor 229 and capacitor 117 are also coupled to the inverting input of opamp 74. The inverting input of opamp 74 is also coupled to resistor 232 (3.16 k ohm) which is coupled in series to capacitor 121 (6.8 uF) which is coupled to ground. The output of opamp 74 is also coupled to resistor 218 (51 ohm) which is coupled in series to capacitor 110 (22 uF) which is coupled to ground through resistor 235 (1 k ohm). The end of resistor 235 that is not coupled to ground is signal path 60 which is the output of amplifier circuit 600.

Within the filter stage of the present invention, series noise is reduced with minimal ballistic deficit. The effects of ballistic deficit reduce the signal amplitude (peak energy level) of the event pulse (e.g., pulse height deficit). Pulse height deficit occurs when the time constant, discussed above, is smaller than the input pulse rise time. However, if the time constant is too large, distortion is introduced as a result of the integration of excess noise.

The filter stage of FIG. 7A and FIG. 7B contains very sharp cutoff frequencies (Q dependent) on the bandwidth of the filter. This results in less ballistic deficit while maintaining the 0.5 us time constant. The Q value within a Sallen-Key filter is defined as the feedback capacitance over the integrating capacitance. Therefore the Q value for the filter of FIG. 7A is expressed below:

$$\begin{aligned}Q(\text{FIG. 7A}) &= \text{Cap } 13/(\text{Cap } 35 + \text{Cap } 11) \\ &= 820 \text{ pF}/(100 + 680) \text{ pF} \\ &= 1.05\end{aligned}$$

The Q value for the filter of FIG. 7B is expressed below:

$$Q(\text{FIG. 7B}) = (\text{Cap 34/Cap 1})/\text{Cap 12}$$
$$= (200 + 100)\,\text{pF}/(820)\,\text{pF}$$
$$= 1.46$$

Since the above values for Q are slightly larger than conventional Sallen-Key filter designs, the present invention introduces circuitry to prevent oscillation of the filter stage. Networks are positioned within the feedback paths to move dominate poles to prevent oscillation. First, in the positive feedback path, resistor 22 is placed in series with the feedback capacitor 13. With resistor 27, a voltage divider between resistors 22 and 27 (FIG. 7A) is provided to reduce the amount of positive feedback signal. Second, the amount of negative feedback is balanced so that oscillation does not occur. This is performed by providing the proper integration circuitry (capacitor 114 and resistor 226) in the negative feedback path. In the negative feedback path of FIG. 7A, a pole is placed over the zero position to extend the breakpoint so the circuit stage 6 does not exceed 180 degrees phase shift. This extends the bandwidth of circuit 6. This circuit provides a sharper filter (bigger Q) with greater bandwidth and increased stability.

As discussed with reference to FIG. 7A, the circuit stage 8 of FIG. 7B also contains a pole in its negative feedback path (resistor 229 and capacitor 117). It is appreciated that with respect to circuit stages 6 and 8, the elements placed in the feedback paths provide for a sharper filter with greater bandwidth and increased stability. This provides a larger Q for the Sallen-Key filter which reduces the effects of ballistic deficit while at the same maintaining the time constant at 0.5 us. Therefore, contributions due to charge trapping phenomena are minimized. Thus the Sallen-Key filter design of the present invention provides a mechanism for utilizing a relatively small time constant with minimum ballistic deficit. It is appreciated that the differentiated signal of circuit stage 4 reduces the contribution of parallel noise while the filter stages 6 and 8 reduces the contribution of series noise.

Figure 8:
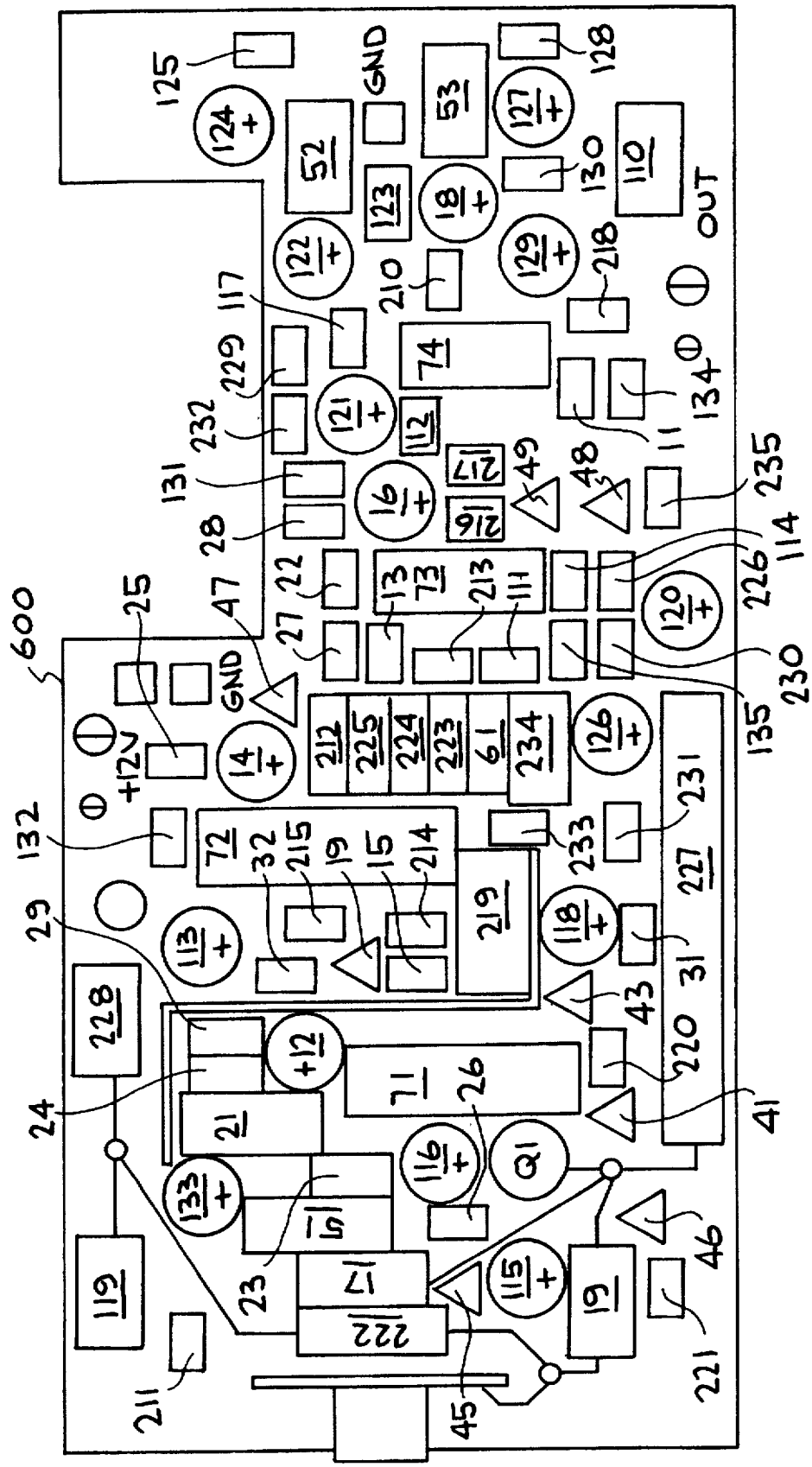
FIG. 8 illustrates an exemplary component layout of one embodiment of the present invention CZT detector unit.

Refer to FIG. 8 which illustrates an exemplary component layout of the present invention amplifier unit 600. Within FIG. 8, like components are numbered with like reference numerals. As shown in FIG. 8, the resistor 227 is not placed directly on the ground plane to reduce the capacitance in the feedback path of circuit stage 2. In one embodiment, most of the resistors and capacitors in the design are of surface mount technology. The integrated circuits, 71, 72, 73, and 74 are laid out side by side, rather than being laid out end to end, to reduce the amount of signal path cross over. Further, the ground planes are uniformly distributed so that "islands" of ground plane do not occur.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A low noise, high bandwidth preamplifier stage for a radio nuclide detector, said preamplifier stage comprising:

a first circuit for providing a first amplification, said first circuit comprising a transistor receiving a first signal at a gate of said transistor, said first signal indicative of a radio nuclide event occurring within a CZT detector;

a second circuit for providing a second amplification, said second circuit comprising an integrated circuit operational amplifier powered by a single ended voltage power supply and ground, and stable over an operational frequency of between 50 kHz and 100 MHz, an output of said first circuit coupled to a non-inverting input of said operational amplifier along a low impedance signal path;

a first feedback circuit path coupled from an output of said operational amplifier to an inverting input of said operational amplifier; and a second feedback circuit path coupled from said output of said operational amplifier to said gate of said transistor, said second feedback path providing both AC and DC feedback.

2. A preamplifier stage as described in claim 1 wherein said transistor is a low noise field effect transistor (FET) and further comprising a capacitor coupled in series between said gate of said transistor and said CZT detector, said capacitor in series with a ferrite bead for absorbing high voltage transient signals.

3. A preamplifier stage as described in claim 1 wherein said first circuit further comprises:

first bias circuitry coupled between said single ended voltage power supply and a drain of said transistor, wherein said first bias circuitry comprises a first resistor coupled to said drain, a parallel coupled combination of a second resistor and an inductor coupled to said first resistor, and a first capacitor coupled to ground and also coupled to said parallel coupled combination of said second resistor and said inductor;

second bias circuitry coupled between a source of said transistor and ground, wherein said second bias circuitry comprises a third resistor and a second capacitor coupled in parallel to ground, wherein said first bias circuitry contributes a high degree of impedance in response to high frequency first signals at said gate and said second bias circuitry contributes a lower degree of impedance in response to said high frequency first signals.

4. A preamplifier stage as described in claim 3 wherein said first bias circuitry contributes 300 times more gain in response to said high frequency first signals in relation to said impedance of said second bias circuitry in response to said high frequency first signals.

5. A preamplifier stage as described in claim 1 wherein said second feedback path comprises a first very high resistance resistor wherein said first very high resistance resistor is characterized in that it contains uniform parasitic capacitance and uniform parasitic inductance along its length.

6. A preamplifier stage as described in claim 5 further comprising a series coupled second very high resistance resistor and a capacitor that are coupled in parallel with said gate line, said second very high resistance resistor characterized in that it contains uniform parasitic capacitance and uniform parasitic inductance along its length, said series coupled second very high resistance resistor and capacitor also coupled to ground and are for reducing parallel noise in said first signal.

7. A preamplifier stage as described in claim 6 wherein said first and said second very high resistance resistors are approximately 1 kM ohm each and maintain this impedance over a wide frequency band.

8. A preamplifier stage as described in claim 5 wherein said second circuit further comprises:
- a first zener diode coupled to said output of said operational amplifier and coupled to a first terminal of a first resistor, said first resistor coupled to ground via a second terminal, said very high resistance resistor also coupled to, said first terminal of said first resistor, wherein said first feedback circuit comprises:
- a second resistor having a first terminal coupled to said output of said operational amplifier and a second terminal coupled to said inverting input of said operational amplifier;
- a first capacitor coupled to said first terminal of said second resistor and said first terminal of said first resistor; and
- a second capacitor coupled to said inverting input of said operational amplifier and to ground.

9. A low power consumption amplification stage of an amplifier unit for a radio nuclide detector, said amplification stage comprising:
- a low noise integrated circuit operational amplifier for receiving a first amplified signal over an input signal path coupled to a non-inverting input of said operational amplifier and for generating an output signal responsive to a leading edge said first amplified signal, said first amplified signal originating from an amplification circuit stage which receives signals from a CZT detector, said operational amplifier powered by a single ended voltage power supply and ground; and
- bias circuitry for providing a virtual ground voltage at inputs of said operational amplifier, said virtual ground voltage being mid between ground and a voltage of said singled ended voltage supply, said bias circuitry also for providing a low impedance low noise path from said input signal path to ground, said bias circuitry comprising:
  - a low resistance resistor having a first terminal coupled to said input signal path and a second terminal;
  - a bypass capacitor having a first terminal coupled to said second terminal of said low resistance resistor and a second terminal coupled to ground; and
  - a zener diode having a first terminal coupled to said second terminal of said low resistance resistor and coupled to said single ended voltage supply and having a second terminal coupled to ground, said bypass capacitor for reducing noise associated with said zener diode.

10. An amplification stage as described in claim 9 wherein said voltage of said single ended voltage supply is +12 volts and said virtual ground voltage is approximately 6 volts.

11. An amplification stage as described in claim 9 further comprising feedback circuitry, said feedback circuitry comprising:
- a resistance element coupled from an output of said operational amplifier to an inverting input of said operational amplifier; and
- a potentiometer and a capacitor coupled together in series and coupled to ground and coupled to said inverting input of said operational amplifier, said potentiometer for providing fine gain adjustment.

12. An amplification stage as described in claim 11 further comprising a resistor and a second capacitor coupled together in series and coupled across said inverting and said non-inverting inputs of said operational amplifier.

13. An amplification stage as described in claim 9 wherein said first terminal of said zener diode is coupled to said singled ended voltage supply through a resistance element.

14. An amplification stage as described in claim 9 wherein said low resistance resistor is approximately 1.1 K ohms.

15. A low power filter stage of an amplifier unit for a radio nuclide detector, said filter stage comprising:
- a low noise integrated circuit first operational amplifier for receiving a first amplified and differentiated signal over an input signal path coupled to a non-inverting input of said first operational amplifier, said first amplified and differentiated signal representing a pulse originating as an event within a CZT detector, said first operational amplifier powered by a single ended voltage power supply and ground, said first operational amplifier configured such that it has a Q value greater than 1.0;
- a low noise integrated circuit second operational amplifier for receiving a signal output from said first operational amplifier, said second operational amplifier for generating, at an output, a near Gaussian pulse having an amplitude value representative of the energy of said event, said second operational amplifier configured such that it has a Q value greater than 1.4;
- a first positive feedback path coupled between an output and a non-inverting input of said first operational amplifier, said first positive feedback path comprising a voltage divider circuit in series with a first capacitor; and
- a first negative feedback path coupled between said output and an inverting input of said first operational amplifier, said first negative feedback path comprising a first integration circuit comprising a second capacitor and a first resistor coupled together in parallel, said first positive and said first negative feedback paths for stabilizing said first operational amplifier.

16. A low power filter stage as described in claim 15 wherein said first and said second operational amplifiers are configured as Sallen-Key filters.

17. A low power filter stage as described in claim 15 further comprising:
- a second positive feedback path coupled between said output and a non-inverting input of said second operational amplifier, said second positive feedback path comprising a third capacitor; and
- a second negative feedback path coupled between said output and an inverting input of said second operational amplifier, said second negative feedback path comprising a second integration circuit comprising a fourth capacitor and a second resistor coupled together in parallel.

18. A low power filter stage as described in claim 15 further comprising:
- a first integration circuit coupled between said first positive feedback path and said non-inverting input of said first operational amplifier, said first integration circuit comprising a second resistor coupled to a pair of parallel coupled capacitors which are coupled to ground;
- a second integration circuit coupled between said second positive feedback path and said non-inverting input of said second operational amplifier, said second integration circuit comprising a third resistor coupled to a third capacitor which is coupled to ground.

19. A low power filter stage as described in claim 17 further comprising:
- a first bias network comprising:
  - a fifth capacitor coupled to ground through a first terminal; and a third resistor coupled to a second terminal of said fifth capacitor, said third resistor coupled to said inverting input of said first operational amplifier, said first bias network for providing a virtual ground for said first operational amplifier at a voltage between said singled ended voltage supply and ground; and a second bias network comprising:
 a sixth capacitor coupled to ground through a first terminal; and a fourth resistor coupled to a second terminal of said sixth capacitor, said fourth resistor coupled to said inverting input of said second operational amplifier, said second bias network for providing a virtual ground for said second operational amplifier at a voltage between said singled ended voltage supply and ground.

* * * * *